United States Patent
Mizumura

(10) Patent No.: US 9,429,852 B2
(45) Date of Patent: Aug. 30, 2016

(54) MICROLENS EXPOSURE SYSTEM

(75) Inventor: Michinobu Mizumura, Yokohama (JP)

(73) Assignee: V TECHNOLOGY CO., LTD., Yokohama-shi, Kanagawa (JP)

(*) Notice: Subject to any disclaimer, the term of this patent is extended or adjusted under 35 U.S.C. 154(b) by 778 days.

(21) Appl. No.: 13/813,130

(22) PCT Filed: Jul. 15, 2011

(86) PCT No.: PCT/JP2011/066217
§ 371 (c)(1),
(2), (4) Date: Jan. 29, 2013

(87) PCT Pub. No.: WO2012/017808
PCT Pub. Date: Feb. 9, 2012

(65) Prior Publication Data
US 2013/0141704 A1 Jun. 6, 2013

(30) Foreign Application Priority Data
Aug. 6, 2010 (JP) .................... 2010-177873

(51) Int. Cl.
*G03B 13/24* (2006.01)
*G03F 7/20* (2006.01)
(Continued)

(52) U.S. Cl.
CPC .......... *G03F 7/70275* (2013.01); *G03F 9/703* (2013.01); *G03F 9/7088* (2013.01); *G02B 3/0006* (2013.01)

(58) Field of Classification Search
CPC .... G03F 9/7026; G03F 9/703; G03F 9/7034; G03F 9/7088; G03F 7/70125; G03F 7/70275; G02B 3/0006
USPC .................... 355/44, 52, 55, 67, 77
See application file for complete search history.

(56) References Cited

U.S. PATENT DOCUMENTS

| 4,767,171 A | * | 8/1988 | Keil ............... G02B 6/4246 385/35 |
| 4,956,546 A | * | 9/1990 | Nishibe ............. G02B 7/28 250/203.1 |

(Continued)

FOREIGN PATENT DOCUMENTS

| JP | 03-020733 A | 1/1991 |
| JP | 08-008164 A | 1/1996 |

(Continued)

OTHER PUBLICATIONS

English language machine translation of Ejiri JP 2007-003829A.*

(Continued)

*Primary Examiner* — Toan Ton
*Assistant Examiner* — Mona M Sanei
(74) *Attorney, Agent, or Firm* — McGinn IP Law Group PLLC

(57) ABSTRACT

A microlens exposure system includes a microlenses array and a mask fixed in place a predetermined space apart, wherein the gap between the microlens array and an exposure substrate can easily be adjusted with high precision to an aligned focal point position of the microlenses. Laser light for exposure is irradiated onto a resist film by microlenses of a microlens array. Light from a microscope passes through a hole in a Cr film of a mask, and the light is transmitted through a microlens and radiated onto the resist film. Whether or not the light transmitted through the microlens has an aligned focal point on the resist film is observed through the microscope, whereby the aligned focal point of exposure light made to converge by the microlenses on the resist film can be distinguished.

18 Claims, 3 Drawing Sheets

(51) Int. Cl.
　　*G03F 9/00*　　(2006.01)
　　*G02B 3/00*　　(2006.01)

(56) References Cited

U.S. PATENT DOCUMENTS

| | | | |
|---|---|---|---|
| 6,195,154 B1 | 2/2001 | Imai | |
| 6,327,025 B1 | 12/2001 | Imai | |
| 2001/0055488 A1 | 12/2001 | Shono | |
| 2004/0071394 A1* | 4/2004 | Gfrorer | B01L 3/50855 385/18 |
| 2009/0310106 A1 | 12/2009 | Mishima | |
| 2010/0118290 A1 | 5/2010 | Sato et al. | |
| 2014/0168648 A1* | 6/2014 | Hashimoto | G03F 9/00 356/401 |

FOREIGN PATENT DOCUMENTS

| | | |
|---|---|---|
| JP | 8-037149 A | 2/1996 |
| JP | 2002-006208 A | 1/2002 |
| JP | 2007-003829 A | 1/2007 |
| TW | 201007375 A | 2/2010 |
| TW | 201019055 A | 5/2010 |
| TW | I442193 B | 6/2014 |

OTHER PUBLICATIONS

International Search Report in PCT/JP2011/066217 dated Aug. 16, 2011(English Translation Thereof).

Taiwanese Office Action dated Nov. 12, 2015 with a Japanese Translation and a partial English translation thereof.

* cited by examiner (a)

(b)

MICROLENS EXPOSURE SYSTEM

TECHNICAL FIELD

The present invention relates to an exposure system that uses a microlens array.

BACKGROUND ART

In conventional practice, exposure systems that use microlens arrays have been used as laser annealing systems for reforming an amorphous silicon film into a polysilicon film by irradiating the amorphous silicon film with laser light and melting and solidifying the amorphous silicon film by the heat of the laser light. Such exposure systems have also been used as exposure systems for photolithography wherein a mask image is projected and exposed on a resist film, and a resist pattern is formed by a subsequent developing process (Patent Document 1).

FIG. 6 is a cross-sectional view showing a projection-exposure type exposure system using a conventional microlens array. A resist film 2 is formed on a substrate 1, and the substrate 1 is conveyed below a microlens exposure system. A conventional microlens exposure system is provided with a microlens array 3 formed by two-dimensionally arranging numerous microlenses 3a, and a mask 4 is arranged above the microlens array 3. The microlens array 3 is formed from a transparent quartz substrate, and the microlenses 3a are machined into the bottom surface of the microlens array 3. The mask 4 is configured by bonding a Cr film 5 to the bottom surface of the transparent substrate, and holes 5a through which laser light passes are formed in the Cr film 5 in positions matching the microlenses 3a. Portions of the mask 4 other than the holes 5a are covered by the Cr film 5, constituting light-blocking portions that prevent laser light from passing through. The mask 4 and the microlens array 3 are fixed in place by a fixing member 6 so as to have a predetermined space in between. The microlens array 3 and the mask 4 can be moved along the optical axis by a suitable drive system, and their distances to the substrate 1 can be adjusted.

In a conventional microlens exposure system configured in this manner, when the laser light for exposure is irradiated onto the mask 4, the laser light that has passed through the holes 5a in the mask 4 is irradiated onto the microlenses 3a of the microlens array 3 and made by the microlenses 3a to converge on the resist film 2 on the substrate 1. A pattern to be projected is formed in the holes 5a, and when the laser light is transmitted through the holes 5a and radiated onto the resist film 2, the pattern is projected onto the resist film 2.

In order for the laser light passing through the microlenses 3a to converge on the resist film 2 on the surface of the substrate 1, a gap G between the substrate 1 and the microlens array 3 must be made to coincide with the focal point position of the microlenses 3a, and this gap G must be managed. In conventional projection-exposure type exposure systems, the gap G has been managed by measuring the distance between the surface of the mask 4 and the surface of the substrate 1 and setting this distance to a predetermined value. However, because quartz substrates on which microlenses are formed have different thicknesses depending on manufacturing conditions, the reality in conventional practice has been that the gap G between the substrate 1 and the microlenses 3a has not been managed. Therefore, in a conventional exposure system, after the distance between the surface of the mask 4 and the surface of the substrate 1 has been set to the predetermined value, exposure and development are performed, and whether or not the resist film 2 on the substrate 1 is in the aligned focal point position of the microlenses 3a is inspected by observing the resulting pattern through a microscope. When the substrate 1 is not in the aligned focal point position of the microlenses 3a, a focus adjustment is performed by trial and error in which the positions of the mask 4 and the microlens array 3 are adjusted, and exposure, development, and microscope observation are performed again to confirm the aligned focal point position. Therefore, much labor has been required in managing the gap G in conventional exposure systems.

In view of this, Patent Document 1 proposes an image exposure system, the object of which is to align with the focal point position with precision. In this image exposure system, a microlens for focal point position detection is provided separate from the microlenses for image exposure, laser light from a light source is transmitted through the microlens for focal point position detection as well, and the laser light is imaged on an imaging position on a resist film. This image is then photographed by a camera, and the position of the microlens array is adjusted along the optical axis so that the focus of the photographed image matches.

PRIOR ART DOCUMENTS

Patent Documents

Patent Document 1: Japanese Laid-open Patent Application No. 2007-3829

DISCLOSURE OF THE INVENTION

Problems the Invention is Intended to Solve

However, with the conventional techniques described above, in an exposure system in which the mask 4 is arranged above the microlens array 3 at a predetermined space from the microlens array 3 as shown in FIG. 6, the space between the microlens array 3 and the substrate 1 is not adjusted. Specifically, a method for adjusting the gap G of Patent Document 1 listed above cannot be applied in the conventional exposure system shown in FIG. 6. In other words, in the exposure system of Patent Document 1, the position of the surface of the microlens array can be detected directly because there is no mask 4, and there is therefore no difficulty in adjusting the gap between the microlens array and the substrate surface.

The present invention was devised in view of these problems, and an object thereof is to provide a microlens exposure system in which the microlens array and the mask are fixed in place a predetermined space apart, wherein the gap between the microlens array and an exposure substrate can be easily adjusted with high precision to an aligned focal point position of the microlenses.

Means for Solving the Problems

A first microlens exposure system according to the present invention is a microlens exposure system comprising a microlens array in which microlenses are arranged one-dimensionally or two-dimensionally, a mask in which transmission holes for laser light are provided to positions corresponding to the microlenses, and a fixing part for fixing the microlens array and the mask in place a predetermined space apart; the microlens exposure system having an inspection microlens provided to the microlens array and having the same shape as the microlenses, an inspection hole provided to the mask in a position corresponding to the inspection microlens, an inspection light radiation part for irradiating inspection light having a focal point position aligned with the inspection hole onto an exposure target substrate through the inspection hole and the inspection microlens, the inspection light radiation part being provided above the mask, and a microscope for observing an image of the inspection light on the substrate; the positions of the microlens array and the mask on the optical axis being adjusted so that the image observed through the microscope has an aligned focal point.

According to the aspect of the invention described above, inspection marks can be provided to the inspection hole, the image on the substrate and images of the inspection marks provided to the inspection hole can be observed through the microscope, and the positions of the microlens array and the mask on the optical axis can be adjusted so that both images have an aligned focal point.

A second microlens exposure system according to the present invention is a microlens exposure system comprising a microlens array in which microlenses are arranged one-dimensionally or two-dimensionally, a mask in which transmission holes for laser light are provided to positions corresponding to the microlenses, and a fixing part for fixing the microlens array and the mask in place a predetermined space apart; the microlens exposure system having an inspection microlens provided to the microlens array and having the same shape as the microlenses, an inspection hole provided to the mask in a position corresponding to the inspection microlens, an inspection light radiation part for irradiating inspection light having a focal point position aligned with the inspection hole on an exposure target substrate through the inspection hole and the inspection microlens, the inspection light radiation part being provided above the mask, and a photosensor for detecting the quantity of the inspection light reflected by the substrate; the positions of the microlens array and the mask on the optical axis being adjusted so that the light quantity detected by the photosensor reaches a maximum.

A third microlens exposure system according to the present invention is a microlens exposure system comprising a microlens array in which microlenses are arranged one-dimensionally or two-dimensionally, a mask in which transmission holes for laser light are provided to positions corresponding to the microlenses, and a fixing part for fixing the microlens array and the mask in place a predetermined space apart; the microlens exposure system having an inspection microlens provided to the microlens array and having the same shape as the microlenses, an inspection hole provided to the mask in a position corresponding to the inspection microlens, an inspection light radiation part for radiating parallel inspection light onto a pattern provided to an exposure target and directing an image transmitted through the pattern onto the inspection microlens, and a microscope for observing the image transmitted through the pattern; the positions of the microlens array and the mask on the optical axis being adjusted so that the image observed through the microscope has an aligned focal point.

According to the aspect of the invention described above, inspection marks can be provided to the inspection hole, the image transmitted through the pattern and images transmitted through the inspection marks provided to the inspection hole can be observed through the microscope, and the positions of the microlens array and the mask on the optical axis can be adjusted so that both images have an aligned focal point.

A fourth microlens exposure system according to the present invention is a microlens exposure system comprising a microlens array in which microlenses are arranged one-dimensionally or two-dimensionally, a mask in which transmission holes for laser light are provided to positions corresponding to the microlenses, and a fixing part for fixing the microlens array and the mask in place a predetermined space apart; the microlens exposure system having an inspection microlens provided to the microlens array and having the same shape as the microlenses, an inspection hole provided to the mask in a position corresponding to the inspection microlens, an inspection light radiation part for radiating parallel inspection light onto a pattern provided to an exposure target and directing an image transmitted through the pattern onto the inspection microlens, and a photosensor for detecting the quantity of the inspection light transmitted through the pattern; wherein the positions of the microlens array and the mask on the optical axis are adjusted so that the light quantity detected by the photosensor reaches a maximum.

EFFECTS OF THE INVENTION

According to the present invention, inspection light having a focal point aligned with the inspection hole provided in the mask is irradiated onto the exposure substrate through the inspection microlens, and the space between the microlens array and the substrate is adjusted either so that the image of inspection light on the substrate observed through the microscope has an aligned focal point, or so that the quantity of the inspection light reflected in the substrate as detected by the photosensor reaches a maximum; therefore, the positions of the microlenses can be extremely easily adjusted with high precision to the aligned focal point position.

BEST MODE FOR CARRYING OUT THE INVENTION

Figure 1:
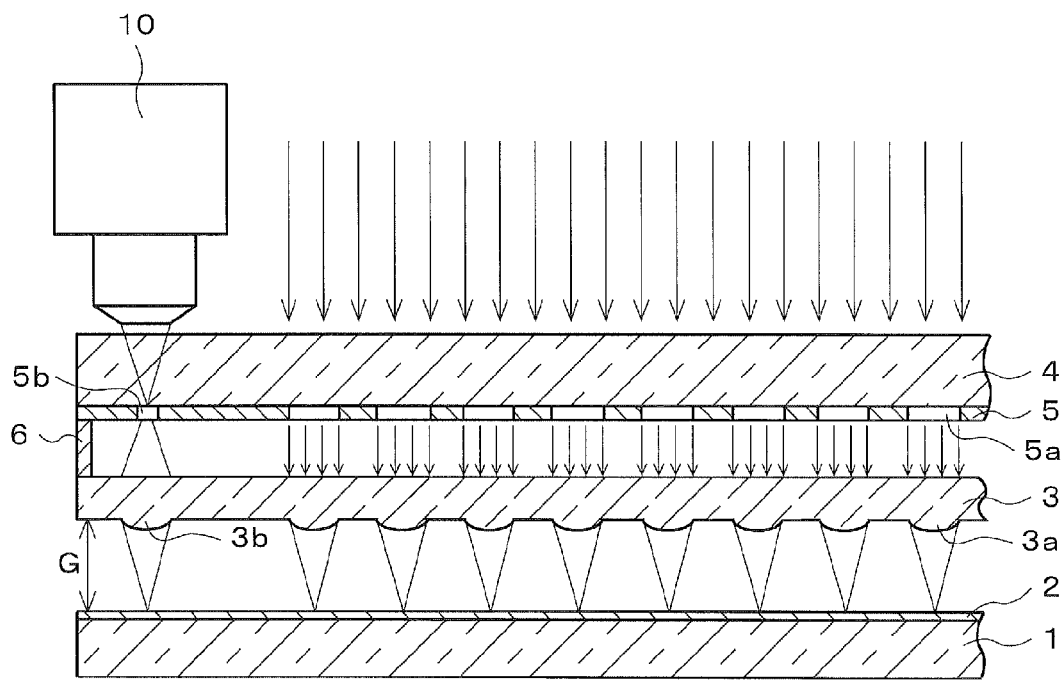
FIG. 1 is a cross-sectional view showing the microlens exposure system of the first embodiment of the present invention.
Figure 6:
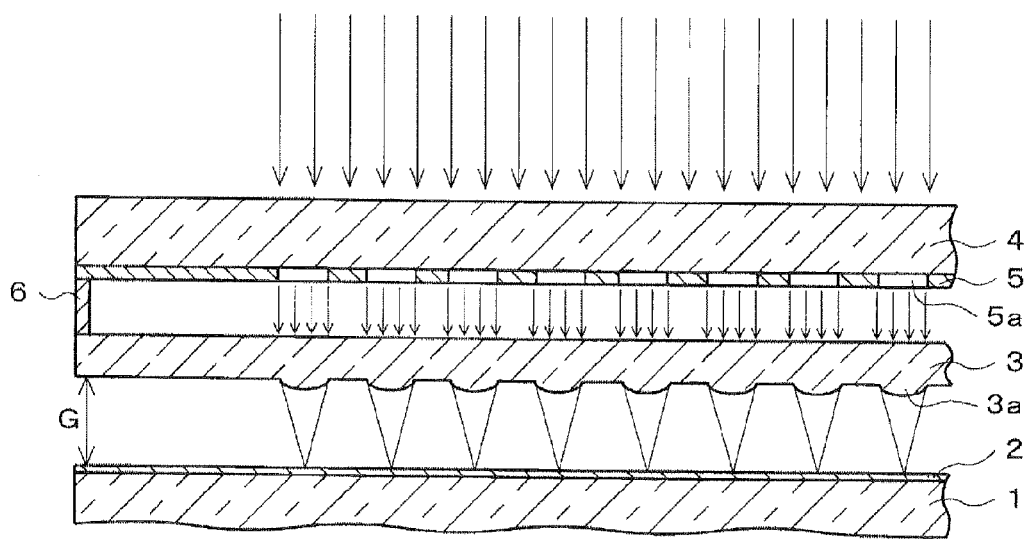
FIG. 6 is a cross-sectional view showing a conventional microlens exposure system.

Embodiments of the present invention will be described in detail hereinbelow with reference to the attached drawings. FIG. 1 is a schematic view showing a microlens exposure system according to the first embodiment of the present invention. In FIG. 1, the same numerals are assigned to the same structural elements as FIG. 6, and detailed descriptions thereof are omitted. In the present embodiment, a microlens 3b for inspection is provided to a position outside of an exposure area composed of microlenses 3a at an end section in a microlens array 3, and a hole 5b smaller than holes 5a is provided in a Cr film 5 of a mask 4, in a position that matches the microlens 3$b$. Patterns to be projected are formed in the holes 5$a$, and when laser light is transmitted through the holes 5$a$ to be radiated onto a resist film 2, the pattern is projected onto the resist film 2. A microscope 10 is provided above the mask 4, and the microscope is stationary relative to the mask 4 and the microlens array 3. The focal position of the microscope 10 is the position of the hole 5$b$ in the mask 4, and when the laser light transmitted through the microlenses 3$a$ of the microlens array 3 is imaged on the resist film 2 on a substrate 1, the light transmitted through the microlens 3$b$ is also imaged on the resist film 2 on the substrate 1. Therefore, due to a mark (not shown) being provided in advance on the resist film 2, if the mark is observed through the microscope 10 and the focal point of the observed mark is aligned in the microscope 10, the position of the resist film 2 on the optical axis will be the position of the aligned focal point in the microscope 10. Even in the present embodiment, the microlens array 3 and the mask 4 can be moved along the optical axis by a suitable drive system and the distance to the substrate 1 can be adjusted, but because the microscope 10 is stationary relative to the microlens array 3 and the mask 4, the focal point of light from the microscope 10 does not change from the position of the hole 5$b$ in the Cr film 5 of the mask 4. The microscope 10 is an incident light microscope, wherein light from a light source is turned into parallel light by an objective lens and radiated onto the substrate (onto the resist film 2), light reflected from the substrate (the resist film) creates a focal point through the inspection hole 5$b$ by the microlens 3$b$, outgoing light from the objective lens is then directed along the same axis, and this incident light is observed. This incident light from the objective lens can be photographed by a camera or the like. Consequently, in the present embodiment, an incident light microscope serves as both the source of light for inspection and a microscope for observing images.

In the microlens exposure system of the first embodiment configured in this manner, the resist film 2 on the substrate 1 is exposed to light by the microlenses 3$a$ of the microlens array 3, but at this time, parallel epi-illumination light is emitted from the microscope 10 toward the inspection hole 5$b$, this epi-illumination light creates a focal point in the hole 5$b$ of the Cr film 5, the light passes through the hole 5$b$ to be radiated onto the microlens array 3, the light is imaged on the resist film 2 by the microlens 3$b$, the reflected light is imaged in the position of the hole 5$b$ by the microlens 3$b$, and the light passes through the hole 5$b$ to become incident on the microscope 10. At this time, when reflected light from the resist film 2 that has become incident on the microscope 10 creates an aligned focal point on the resist film 2, the image observed through the microscope 10 is also aligned with the focal point. Laser light transmitted through the microlenses 3$a$ of the exposure area thereby also creates aligned focal points on the resist film 2.

Consequently, when the image of the resist film 2 observed through the microscope 10 is not an aligned focal point image, the microlens array 3 and the mask 4 may be moved together with the microscope 10 along the optical axis by a suitable drive system, the image may be observed through the microscope 10, and the position on the optical axis where the image is an aligned focal point may be searched. The gap G of the exposure system can thereby be easily adjusted with high precision to a predetermined aligned focal point position.

Figure 4:
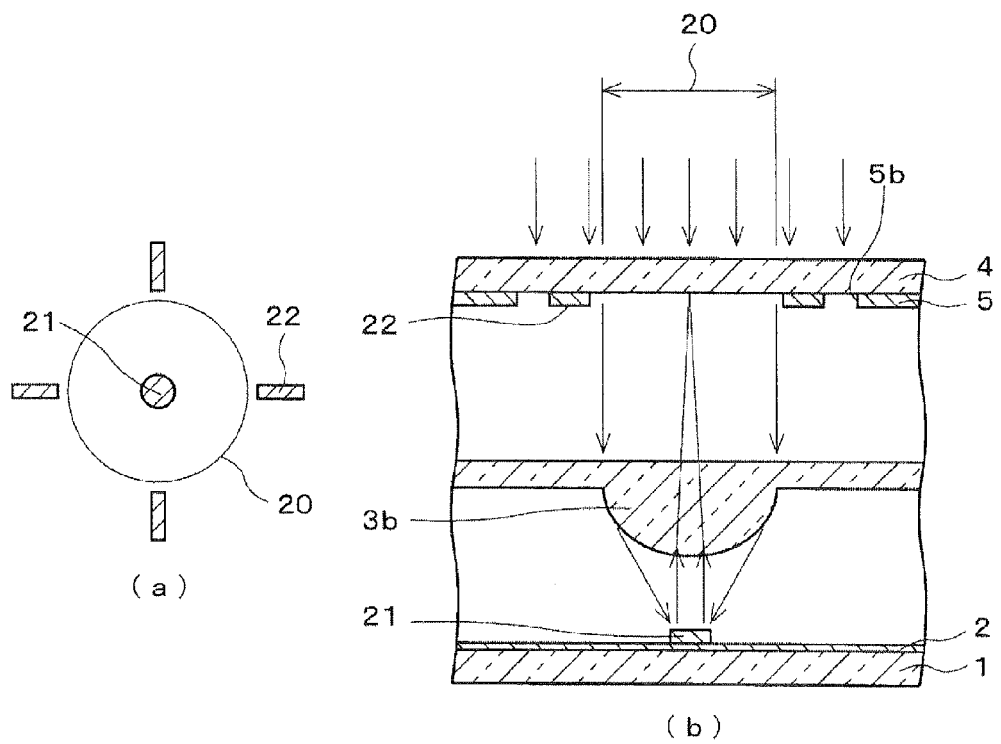
FIGS. 4(a) and (b) are drawings showing a modification of the first embodiment.

Inspection marks 22 can be provided in the inspection hole 5$b$, as shown in FIGS. 4($a$) and ($b$). In the exposure system shown in the cross-sectional view of FIG. 4($b$), inspection marks 22 are formed inside the inspection hole 5$b$, and a substrate pattern 21 is provided on the resist film 2 on the surface of the substrate 1. After the parallel epi-illumination light has been transmitted through the hole 5$b$, the light is made to converge into a focal point on the substrate pattern 21 by the microlens 3$b$. In this case, the substrate pattern 21 is a circular pattern, for example, provided in the center of a visible area 20 of the microlens 3$b$ as shown in FIG. 4($a$), and the inspection marks 22 are formed outside of the visible area 20 of the microlens 3$b$, as line segments extending in a radial formation in four directions from the center of the visible area 20.

The image of the pattern 21 on the resist film 2 of the substrate 1 and the images of the inspection marks 22 provided to the inspection hole 5$b$ are observed simultaneously through the microscope 10, and the positions of the microlens array 3 and the mask 4 on the optical axis are adjusted so that both images are on the aligned focal point. The precision of the aligned focal point can thereby be increased. In the embodiment shown in FIG. 1, the microscope 10 and the mask 4 are mechanically fixed in place at positions such that the inspection light from the microscope 10 creates a focal point through the hole 5$b$. In the modification shown in FIG. 4, however, although the microscope 10 and the mask 4 are ultimately fixed in place, first, the positional relationship of the microscope 10 and the mask 4 is adjusted by aligning the focal point of the inspection marks 22, the microscope and mask are then fixed in place, and the spaces between the microlens array 3, the mask 4, and the substrate 1 can then be adjusted so that the focal point aligns on the substrate pattern 21 on the substrate.

As described above, the marks (the pattern 21) formed on the surface of the resist film 2 on the substrate 1 are point-like marks forming a circle, for example, and the marks (the inspection marks 22) formed on the inspection hole 5$b$ of the mask 4 are in the form of line segments extending in a radial formation, but, as shall be apparent, the pattern 21 and inspection marks 22 are not limited to the formations described above. The inspection marks 22 formed in the inspection hole 5$b$ must be provided at positions outside of the visible area 20 of the microlens 3$b$. When the inspection marks 22 are positioned inside the visible area of the microlens 3$b$, the parallel epi-illumination light radiated from the microscope 10 onto the microlens 3$b$ is blocked, and the quantity of illumination light radiated onto the resist film 2 of the substrate 1 is reduced.

Figure 2:
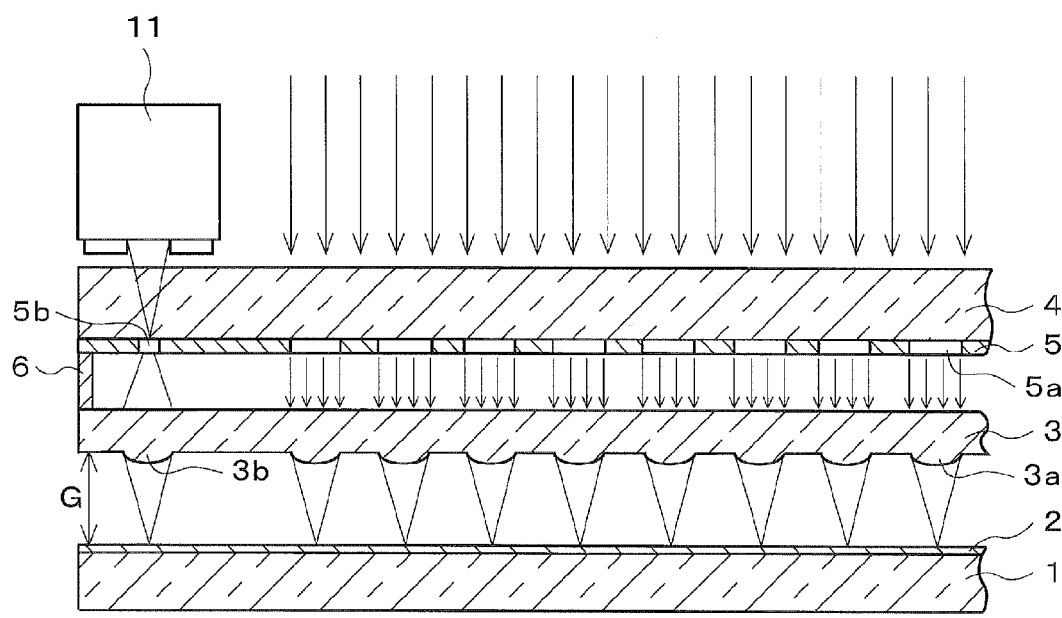
FIG. 2 is a cross-sectional view showing the microlens exposure system of the second embodiment of the present invention.

Next, the second embodiment of the present invention will be described. FIG. 2 is a cross-sectional view showing the present embodiment. In the present embodiment, a photosensor 11 is provided in place of the microscope 10 of the first embodiment. This photosensor 11 is also fixed in place relative to the microlens array 3 and the mask 4, and the photosensor 11 radiates light that is aligned in focal point position with the hole 5$b$ onto the microlens 3$b$.

Next, the action of the present embodiment will be described. After creating a focal point through the hole 5$b$, light from the photosensor 11 expands and becomes incident on the microlens 3$b$, the light is made to further converge by the microlens 3$b$, and the light is irradiated on the resist film 2 on the substrate 1. The quantity of light reflected by the resist film 2 is detected by the photosensor 11 via the microlens 3$b$ and the hole 5$b$. At this time, when this light has created an aligned focal point on the resist film 2, the reflected light thereof creates a focal point in the hole 5$b$ and then becomes incident on the photosensor 11. Therefore, a large quantity of light is detected. On the other hand, when the light incident on the resist film 2 is not creating an aligned focal point on the resist film 2, the reflected light becomes scattered without creating a focal point through the hole 5b, and some of the light is therefore blocked by the Cr film 5 surrounding the hole 5b, not to become incident on the photosensor 11. Consequently, the quantity of light detected by the photosensor 11 is reduced in this case. Consequently, when the quantity of reflected light is measured by the photosensor 11 and the detected light quantity is at a maximum, the light transmitted through the microlenses 3a, 3b of the microlens array 3 comes to create an aligned focal point on the resist film 2. Therefore, if the positions of the microlens array 3 and mask 4 on the optical axis are adjusted so that the quantity of light detected by the photosensor 11 reaches a maximum, the gap G between the microlens array 3 and the substrate 1 can be easily adjusted with high precision to a predetermined value.

Figure 3:
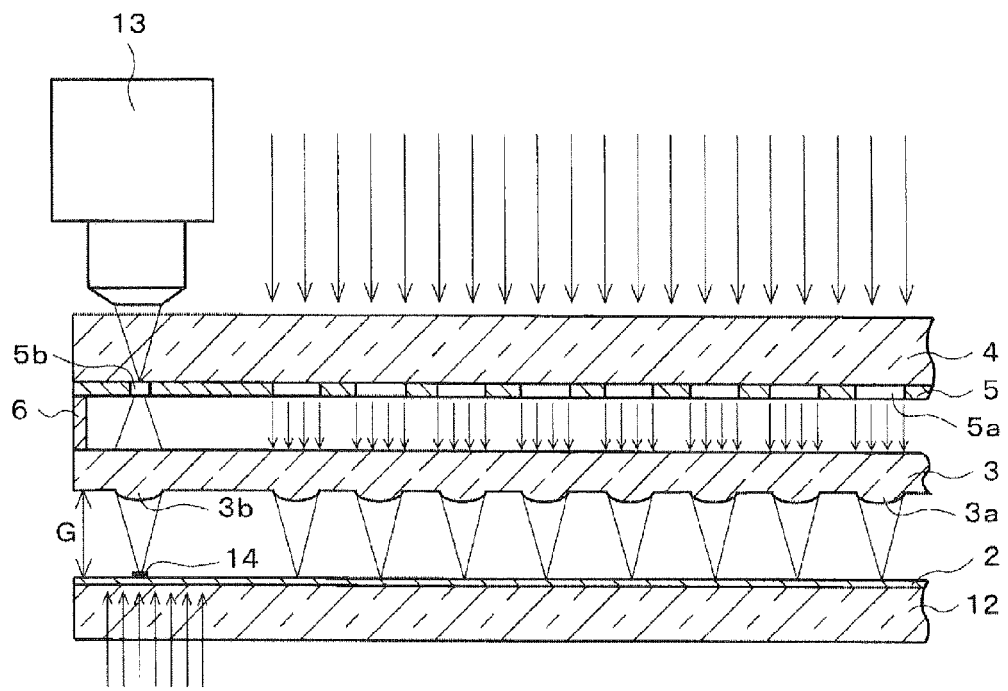
FIG. 3 is a cross-sectional view showing the microlens exposure system of the third embodiment of the present invention.

Next, the third embodiment of the present invention will be described. FIG. 3 is a cross-sectional view showing the present embodiment. In the present embodiment, a transmission microscope 13 is used in place of the epi-illumination microscope 10 of the first embodiment. A substrate 12 is a transparent substrate, and a pattern 14 is formed at a position where a focal point is to be created in the resist film 2. Parallel light is radiated onto the pattern 14 from the bottom surface of the substrate 12.

The pattern 14 has the shape of a circle, a striped pattern, or the like, the parallel light radiated from the bottom surface of the transparent substrate 12 passes through this pattern 14, and an image of the pattern 14 is formed in the position of the hole 5b by the microlens 3b.

Next, the action of the microlens exposure system configured as described above will be described. When parallel light is radiated onto the pattern 14 from the bottom surface of the transparent substrate 12, light transmitted through the pattern 14 is made to converge by the microlens 3b and is imaged on the position of the hole 5b, and the light is then incident inside the transmission microscope 13 via the objective lens of the transmission microscope 13. Whether or not the gap G is in the predetermined focal point position is distinguished by observing the image of the pattern 14 incident on the transmission microscope 13. Specifically, when the gap G is the focal point distance of the microlens 3b, an image of the pattern 14 is made by the microlens 3b into an aligned focal point on the position of the hole 5b. The pattern-transmitted light incident on the objective lens of the transmission microscope 13 is then either observed as an aligned focal point through the eye lens of the transmission microscope 13, or imaged on a charged coupled device (CCD) of a camera. However, when the gap G is not the predetermined focal point position, the light transmitted through the pattern 14 is not made by the microlens 3b into an aligned focal point through the hole 5b, but is observed as an image not aligned with the focal point in the transmission microscope 13. Thus, by observing the pattern 14 on the resist film 2 through the transmission microscope 13 and adjusting the gap G, the gap G can be adjusted so that the focal point positions of the microlenses 3a fall on the resist film 2.

Figure 5:
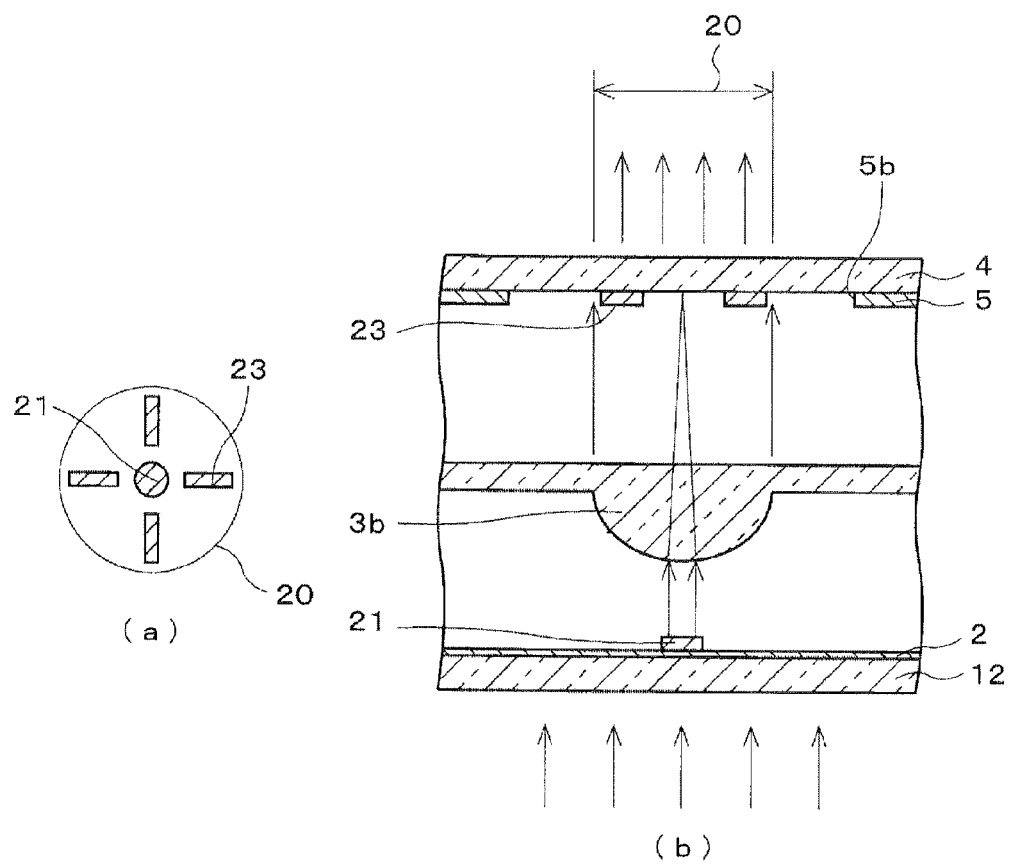
FIGS. 5(a) and (b) are drawings showing a modification of the third embodiment.

FIGS. 5(a) and (b), similar to FIG. 4, show a modification of the third embodiment of FIG. 3, wherein a substrate pattern 21 is provided on the resist film 2 on the transparent substrate 12 and inspection marks 23 are provided inside the inspection hole 5b. In the present modification, however, the inspection marks 23 inside the inspection hole 5b are also provided inside the visible area 20 of the microlens 3b. The substrate pattern 21 is a circular pattern disposed in the center of the visible area 20 of the microlens 3b, for example, and the inspection marks 23 are patterns in the form of line segments extending in a radial formation in four directions centered around the substrate pattern 21, for example.

In the present modification, parallel transillumination light radiated from the bottom surface side of the transparent substrate 12 is blocked by the substrate pattern 21 on the resist film 2 on the transparent substrate 12 to become incident on the microlens 3b, and an image of the pattern 21 is made to converge by the microlens 3b into an aligned focal point through the inspection hole 5b. An image of this pattern 21 is incident on the transmission microscope 13 via the objective lens, and this image is either observed through the eye lens or photographed by a camera. The inspection marks 23 inside the visible area of the microlens 3b also radiate transillumination light, and an image of the inspection marks 23 is also incident on the transmission microscope 13.

In the present modification as well, an image of the substrate pattern 21 on the resist film 2 of the substrate 12 and an image of inspection marks 23 provided to the inspection hole 5bare observed simultaneously through a microscope 13, and the positions of the microlens array 3 and the mask 4 on the optical axis are adjusted so that the two images have an aligned focal point. The precision of the aligned focal point can thereby be increased. In the present modification, transillumination radiated from the back surface of the substrate 12 is used to assess whether or not the images of the substrate pattern 21 and the inspection marks 23 have an aligned focal point, and the inspection marks 23 can therefore be formed within the visible area of the microlens 3b.

In the embodiment shown in FIG. 3, instead of observing the aligned focal point of the images through the transmission microscope 13, the quantity of light detected by a photosensor can be measured to determine whether or not the gap G coincides with the focal point distance of the microlenses 3a, similar to the embodiment shown in FIG. 2. Whether or not the gap G is in the predetermined focal point position can be distinguished by radiating parallel light from the bottom surface of the transparent substrate 12, causing the light transmitted through the pattern 14 to converge by the microlens 3b, guiding the light passing through the hole 5b to the photosensor 11 (see FIG. 2), and using the photosensor 11 to determine whether or not the maximum light quantity has been obtained. If the gap G is the predetermined focal point distance and the laser light from the microlenses 3a has aligned focal points on the resist film 2, light radiated from the bottom surface of the transparent substrate 12 onto the pattern 14 and transmitted through the pattern 14 is made by the microlens 3b to create a focal point through the hole 5b. The light passes through the small hole 5b and most of the light quantity is detected by the photosensor 11, but when the gap G has deviated from the focal point position, the light transmitted through the pattern 14 is not made by the microlens 3b to create an aligned focal point through the hole 5b, the light spreads to the portion of the Cr film 5 in the periphery of the hole 5b, and the quantity of light passing through the small hole 5b decreases. Therefore, the light quantity is measured with the photosensor 11 and the mask 4 and the microlens array 3 are moved along the optical axis, and when the detected light quantity has reached the maximum, the gap G coincides with the focal point distance of the microlenses 3a, and the laser light made to converge by the microlenses 3a creates aligned focal points on the resist film 2.

The embodiments described above address an exposure system in which a predetermined pattern is exposed on a resist film, but the present invention can also be applied to an annealing system wherein an amorphous silicon film is exposed and annealed by laser light, thereby forming a low-temperature polysilicon film.

INDUSTRIAL APPLICABILITY

The present invention significantly contributes to simplifying the focus adjustment for adjusting the space between a microlens array and an exposure substrate to an aligned focal point of a microlens with high precision in an exposure system using a microlens array.

KEY

1: substrate
2: resist film
3: microlens array
3a, 3b: microlenses
4: mask
5: Cr film
5a, 5b: holes
6: fixing member
10: microscope (epi-illumination type)
11: photosensor
12: transparent substrate
13: transmission microscope
14: pattern
21: pattern
21, 23: inspection marks

The invention claimed is:

1. A microlens exposure system comprising:
a microlens array in which microlenses are arranged one-dimensionally or two-dimensionally;
a mask in which transmission holes for laser light are provided to positions corresponding to the microlenses;
a fixing part for fixing said microlens array and said mask in place a predetermined space apart, which are apart from each other;
an inspection microlens provided to said microlens array and having the same shape as said microlenses:
an inspection hole provided to said mask in a position corresponding to said inspection microlens;
an inspection light radiation part for irradiating inspection light having a focal point position aligned with said inspection hole onto an exposure target substrate through said inspection hole and said inspection microlens, the inspection light radiation part being provided above said mask; and
a microscope for observing an image of said inspection light on said substrate,
the positions of said microlens array and said mask on the optical axis being adjusted so that the image observed through said microscope has an aligned focal point.

2. The microlens exposure system according to claim 1, further comprising inspection marks provided to said inspection hole, the image on said substrate and images of said inspection marks provided to said inspection hole being observed through said microscope, and the positions of said microlens array and said mask on the optical axis being adjusted so that both images have an aligned focal point.

3. The microlens exposure system according to claim 1, wherein the mask includes a resist pattern and the mask forms an image pattern.

4. The microlens exposure system according to claim 1, wherein the mask is disposed above the microlens array.

5. The microlens exposure system according to claim 1, further comprising a drive system configured to move the microlens array and the mask together.

6. The microlens exposure system according to claim 1, wherein an image of the pattern on a resist film of exposure target substrate and images of inspection marks provided to the inspection hole are observed simultaneously.

7. The microlens exposure system according to claim 1, wherein the inspection hole includes inspection marks.

8. The microlens exposure system according to claim 7, wherein a positional relationship of the microscope and the mask is adjusted by aligning the focal point of the inspection marks.

9. A microlens exposure system comprising:
a microlens array in which microlenses are arranged one-dimensionally or two-dimensionally;
a mask in which transmission holes for laser light are provided to positions corresponding to the microlenses;
a fixing part for fixing said microlens array and said mask in place a predetermined space apart, which are apart from each other;
an inspection microlens provided to said microlens array and having the same shape as said microlenses;
an inspection hole provided to said mask in a position corresponding to said inspection microlens;
an inspection light radiation part for irradiating inspection light having a focal point position aligned with said inspection hole on an exposure target substrate through said inspection hole and said inspection microlens, the inspection light radiation part being provided above said mask; and
a photosensor for detecting the quantity of said inspection light reflected by said substrate,
the positions of said microlens array and said mask on the optical axis being adjusted so that the light quantity detected by said photosensor reaches a maximum.

10. The microlens exposure system according to claim 7, wherein the mask includes a resist pattern and the mask forms an image pattern.

11. The microlens exposure system according to claim 7, wherein the mask is disposed above the microlens array.

12. A microlens exposure system comprising:
a microlens array in which microlenses are arranged one-dimensionally or two-dimensionally;
a mask in which transmission holes for laser light are provided to positions corresponding to the microlenses;
a fixing part for fixing said microlens array and said mask in place a predetermined space apart, which are apart from each other;
an inspection microlens provided to said microlens array and having the same shape as said microlenses;
an inspection hole provided to said mask in a position corresponding to said inspection microlens;
an inspection light radiation part for radiating parallel inspection light onto a pattern provided to an exposure target and directing an image transmitted through said pattern onto said inspection microlens; and
a microscope for observing the image transmitted through said pattern,
the positions of said microlens array and said mask on the optical axis being adjusted so that the image observed through said microscope has an aligned focal point.

13. The microlens exposure system according to claim 8, further comprising inspection marks provided to said inspection hole, the image transmitted through said pattern and images transmitted through said inspection marks provided to said inspection hole being observed through said microscope, and the positions of said microlens array and said mask on the optical axis being adjusted so that both images have an aligned focal point.

14. The microlens exposure system according to claim 12, wherein the mask includes a resist pattern and the mask forms an image pattern.

15. The microlens exposure system according to claim 12, wherein the mask is disposed above the microlens array.

16. A microlens exposure system comprising:
- a microlens array in which microlenses are arranged one-dimensionally or two-dimensionally;
- a mask in which transmission holes for laser light are provided to positions corresponding to the microlenses;
- a fixing part for fixing said microlens array and said mask in place a predetermined space apart, which are apart from each other;
- an inspection microlens provided to said microlens array and having the same shape as said microlenses;
- an inspection hole provided to said mask in a position corresponding to said inspection microlens;
- an inspection light radiation part for irradiating parallel inspection light onto a pattern provided to an exposure target and directing an image transmitted through said pattern onto said inspection microlens; and
- a photosensor for detecting the quantity of said inspection light transmitted through said pattern,
- the positions of said microlens array and said mask on the optical axis being adjusted so that the light quantity detected by said photosensor reaches a maximum.

17. The microlens exposure system according to claim 16, wherein the mask includes a resist pattern and the mask forms an image pattern.

18. The microlens exposure system according to claim 16, wherein the mask is disposed above the microlens array.

* * * * *